United States Patent
Lloyd

(10) Patent No.: US 11,128,071 B2
(45) Date of Patent: Sep. 21, 2021

(54) INTERFACE FOR A PRINTED CIRCUIT BOARD ASSEMBLY ADAPTER MODULE

(71) Applicant: Schweitzer Engineering Laboratories, Inc., Pullman, WA (US)

(72) Inventor: Greg Alden Lloyd, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/812,747

(22) Filed: Mar. 9, 2020

(65) Prior Publication Data

US 2021/0126388 A1   Apr. 29, 2021

Related U.S. Application Data

(60) Provisional application No. 62/926,091, filed on Oct. 25, 2019.

(51) Int. Cl.
*H01R 12/71* (2011.01)
*H01R 12/70* (2011.01)
*H01R 12/52* (2011.01)

(52) U.S. Cl.
CPC ......... *H01R 12/714* (2013.01); *H01R 12/523* (2013.01); *H01R 12/7047* (2013.01); *H01R 12/7058* (2013.01)

(58) Field of Classification Search
CPC ............... H01R 12/714; H01R 12/523; H01R 12/7047; H01R 12/7058
USPC .......................................................... 439/55
See application file for complete search history.

(56) References Cited

U.S. PATENT DOCUMENTS

| | | | | |
|---|---|---|---|---|
| 4,812,754 A | * | 3/1989 | Tracy | G01R 1/07314 324/72.5 |
| 5,120,238 A | * | 6/1992 | Marks | H05K 7/1023 439/331 |
| 5,249,989 A | * | 10/1993 | Alsch | H01R 4/301 439/812 |
| 5,387,120 A | * | 2/1995 | Marks | H05K 7/1023 439/331 |
| 5,487,751 A | * | 1/1996 | Radons | A61B 5/333 607/1 |

(Continued)

FOREIGN PATENT DOCUMENTS

DE   102011054260   4/2013
DE   202013101438   7/2014

OTHER PUBLICATIONS

INGUN. Interface blocks Reliable in-process signal transmission. Catalog 14.1. INGUN Prufmittelbau GmbH, Germany. Sep. 2018.

*Primary Examiner* — Alexander Gilman
(74) *Attorney, Agent, or Firm* — Fletcher Yoder, P.C.

(57) ABSTRACT

Systems for interfacing a printed circuit board assembly (PCBA) adapter module to a receiver housing are provided. The receiver housing may have a first interface mounted on the receiver housing via a first mount and the PCBA adapter module may have a second interface mounted on the adapter module via a second mount. One of the interfaces has a protruding feature that aligns the interfaces when matingly engaged, while the other interface has a centering hole opposite the protruding feature. The first centering hole is enlarged with respect to an axis of an insertion-angle plane such that the protruding feature substantially clears the centering hole without causing either interface to exceed a limit of free-play between that interface and its respective mount.

20 Claims, 8 Drawing Sheets

(56) References Cited

U.S. PATENT DOCUMENTS

| | | | | |
|---|---|---|---|---|
| 5,516,303 | A * | 5/1996 | Yohn | H01R 13/6315 |
| | | | | 439/248 |
| 5,529,514 | A * | 6/1996 | Gargiulo | H01R 12/7023 |
| | | | | 439/567 |
| 5,688,128 | A * | 11/1997 | Ikeya | H05K 7/1023 |
| | | | | 439/73 |
| 6,297,654 | B1 * | 10/2001 | Barabi | G01R 1/0433 |
| | | | | 324/756.02 |
| 6,758,682 | B1 * | 7/2004 | Kosmala | H01R 13/2421 |
| | | | | 439/66 |
| 7,134,909 | B2 * | 11/2006 | Baba | G01R 1/0416 |
| | | | | 439/557 |
| 7,567,075 | B2 * | 7/2009 | Kostuchowski | E05C 3/14 |
| | | | | 324/750.25 |
| 7,651,340 | B2 * | 1/2010 | Barabi | G01R 1/0466 |
| | | | | 439/73 |
| 10,439,324 | B2 * | 10/2019 | Nishii | H01R 13/62938 |
| 10,874,032 | B2 * | 12/2020 | Leigh | H01L 23/427 |
| 2007/0105425 | A1 * | 5/2007 | Wang | H05K 7/142 |
| | | | | 439/326 |
| 2013/0157506 | A1 * | 6/2013 | Grek | H01R 9/0521 |
| | | | | 439/578 |
| 2015/0318640 | A1 * | 11/2015 | Gibeau | H01R 24/20 |
| | | | | 439/489 |

* cited by examiner

INTERFACE FOR A PRINTED CIRCUIT BOARD ASSEMBLY ADAPTER MODULE

CROSS REFERENCE TO RELATED APPLICATION

The present application claims the benefit under 35 U.S.C. § 119(e) of U.S. Provisional Patent Application No. 62/926,091, filed Oct. 25, 2019, entitled "INTERFACE FOR A PRINTED CIRCUIT BOARD ASSEMBLY," which is hereby incorporated by reference in its entirety for all purposes.

BACKGROUND

This disclosure relates to an interface for a printed circuit board assembly (PCBA), and specifically, an interface for coupling the PCBA to a test fixture.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Many printed circuit board assemblies (PCBAs) are tested after assembly using special test fixtures. Such test fixtures often incorporate small spring-loaded nail-like electrodes that make electromechanical connection with various components and circuits on the PCBAs. In some cases, test fixtures are built to be specific to just one type of PCBA; in such fixtures, the signals from the nail-like electrodes are routed directly to switching and measurement instruments. In other cases, however, PCBAs are tested on modular test fixture systems that feature a universal receiver into which PCBA-specific adapter modules are inserted. The adapter modules electrically couple to the receiver via one or more pairs of multi-pole electrical interface connectors; specifically, via an adapter module-side interface and a receiver-side interface. Some types of modular test fixtures mate the adapter modules to the receivers in a linear motion that is compatible with multi-pole electrical interface connectors, which must be mated with their faces substantially coplanar while their electrical contacts are matingly engaging each other. Other types of modular test fixture systems involve inserting the adapter modules initially at an angle into a universal receiver before being lowered all the way and then locked into place to mate their multi-pole electrical interface connectors. Unfortunately, for modular designs where adapter modules are inserted at an angle into a universal receiver, to avoid damaging and breaking the adapter module-side interface, the receiver-side interface, or both, operators must take great care during insertion to never increase the adapter module's angle even slightly after having pushed the adapter module forward (post-insertion lifting) into the universal receiver. Unfortunately, such care is seldom rigorously adhered to at high-volume manufacturers with many operators. As a consequence, the adapter module-side interface, the receiver-side interface, or both may break. Such breakage is especially costly due to the direct cost of repair as well as disruption to production workflow and/or downtime.

One workaround to avoid breakage practiced by vendors omits alignment features from their multi-pole electrical interface connectors; however, this increases wear on some types of electrical contacts and alignment features cannot be omitted with certain types of electrical contacts, such as those carrying radio frequency (RF) signals. Other workarounds practiced by test fixture vendors entail adding hole liners (barrel-like metal reinforcements) to the alignment features on their multi-pole electrical interface connectors; however, doing so increases cost and breakage still occurs due to the high mechanical advantage from the large size of test fixtures.

DETAILED DESCRIPTION

Figure 1:
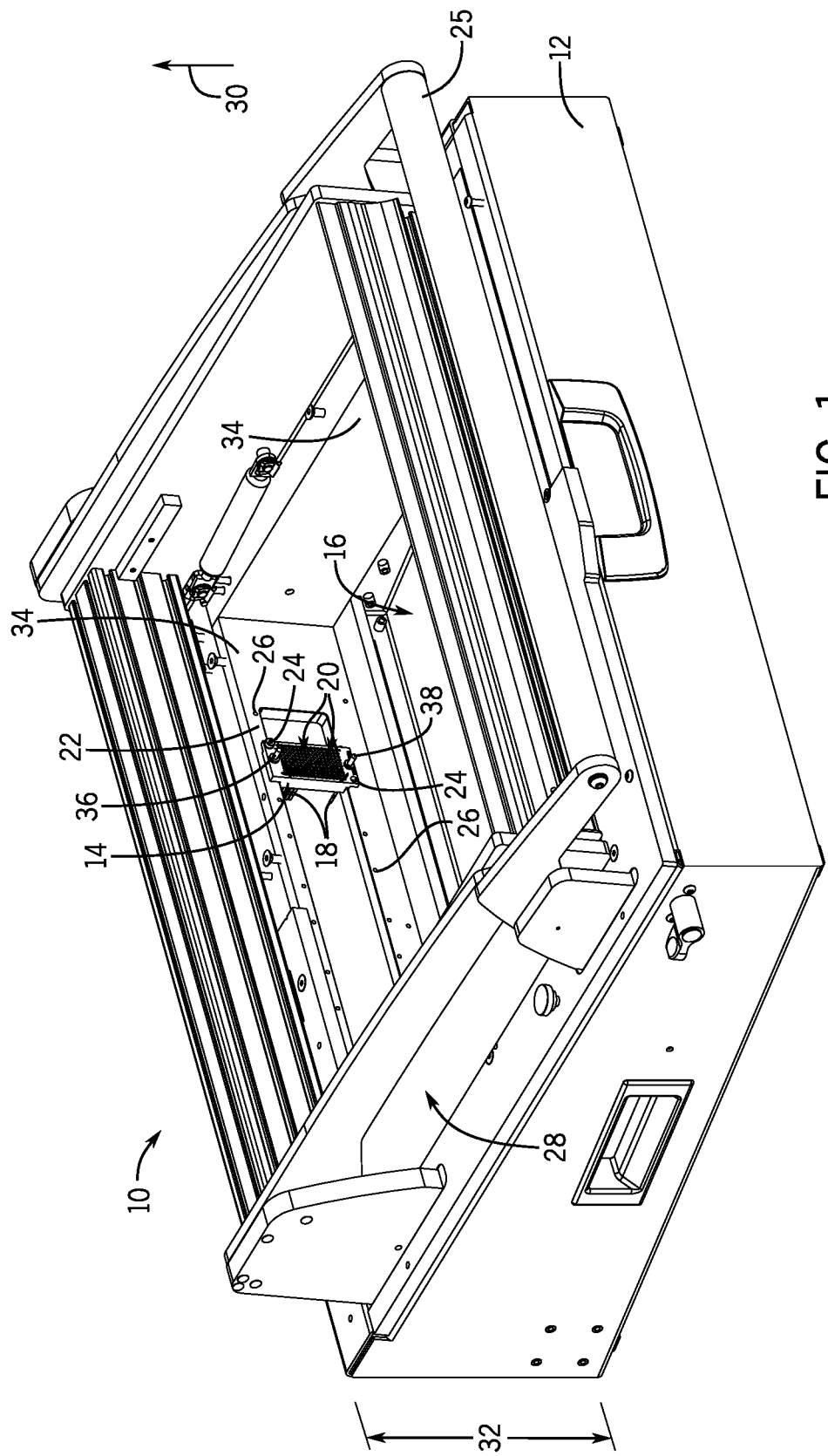
FIG. 1 is a perspective view of an example of a structural base or housing of a test fixture that receives, at an angle, an adapter module for a printed circuit board assembly (PCBA), in accordance with an example of the present disclosure.

One or more specific examples will be described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various examples of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one example" or "an example" of the present disclosure are not intended to be interpreted as excluding the existence of additional examples that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Printed circuit board assemblies (PCBAs) may be disposed in or otherwise coupled to a PCBA adapter module, which may include an interface (e.g., an interconnecting interface) that engages with and/or couples to a test fixture to enable testing of the PCBA to occur. For modular designs where adapter modules are inserted at an insertion angle into a universal receiver, to avoid damaging and breaking the adapter module-side interface, the receiver-side interface, or both, operators must take great care during insertion to never increase the adapter module's angle even slightly after having pushed the adapter module forward (post-insertion lifting) into the universal receiver. Unfortunately, such care is seldom rigorously adhered to at high-volume manufacturers with many operators. As a consequence, the adapter module-side interface, the receiver-side interface, or both may break. Such breakage is especially costly due to the direct cost of repair as well as disruption to production workflow and/or downtime.

This disclosure makes an adapter module-side interface and a receiver-side interface substantially immune to post-insertion lifting damage without sacrificing alignment accuracy and without appreciably increasing costs (e.g., that would otherwise be incurred with the addition of metal hole liner reinforcements to adapter module-side interfaces). As described below, an improved interface may include a first centering hole (e.g., a first centering opening) and a second centering hole (e.g., a second centering opening) that engage protrusions such as a first post and a second post, respectively, of a receiver of a test fixture (or vice versa). The first centering hole may be positioned above the second centering hole with respect to a length (e.g., height) of the interface. Further, the first centering hole may include an oblong and/or obround shape that enables movement of the first post of the receiver within the first centering hole, as the PCBA adapter module is disposed in the structural housing and/or base of the test fixture. Therefore, as the PCBA adapter module is disposed into the structural housing and/or base of the test fixture at an angle with respect to the face of the receiver, the first centering hole may enable the first post to move within the first centering hole and reduce an amount of force applied to the first post. Additionally, the geometry of the first centering hole may enable the first post to move within the first centering hole while aligning the second centering hole with the second post and/or aligning the interface with the receiver (e.g., positioning a first face of the interface to be substantially parallel to a second face of the receiver). Additionally, the second centering hole may also include a chamfered lip that guides the second post into the second centering hole as the PCBA adapter module is disposed into the structural housing and/or base of the test fixture at an angle with respect to the face of the receiver. The chamfered lip may reduce forces applied to the second post that would occur in traditional interfaces that enable the second post to directly contact a planar surface of the interface. As the first and second centering holes are aligned with the first and second posts, respectively, a plurality of pins (e.g., electrical wires) may align with, but not engage, corresponding pin holes (e.g., an array of pin holes or an array of pin openings) of the interface. The PCBA adapter module may then be further directed toward the receiver of the test fixture to enable the plurality of pins to be disposed in the corresponding pin holes of the interface to electrically connect the PCBA to the test fixture.

The examples of the present disclosure will be best understood by reference to the drawings, wherein like parts are designated by like numerals throughout. The components of the disclosed examples, as generally described and illustrated in the figures herein, could be arranged and designed in a wide variety of different configurations. Thus, the following detailed description of the examples of the systems and methods of the disclosure is not intended to limit the scope of the disclosure, as claimed, but is merely representative of possible examples of the disclosure. In some cases, well-known features, structures or operations are not shown or described in detail. Furthermore, the described features, structures, or operations may be combined in any suitable manner in one or more examples. The components of the examples as generally described and illustrated in the figures herein could be arranged and designed in a wide variety of different configurations.

FIG. 1 is a perspective view of an example of a test fixture 10 having a receiver housing 12 and a receiver-side interface 14 to engage an interface of a printed circuit board assembly (PCBA) adapter module. As shown in the illustrated example, the receiver housing 12 of the test fixture 10 includes an opening 16 that may receive the PCBA adapter module to electrically couple the PCBA to circuitry and/or other components of the test fixture 10. For example, the PCBA adapter module may enable PCBAs to be coupled to the circuitry and/or other components of the test fixture 10 via the receiver-side interface 14. The receiver-side interface 14 includes a plurality of pins 18 extending through openings 20 of the receiver-side interface 14. The plurality of pins 18 may be coupled to the circuitry and/or other components of the test fixture 10 and may engage with the PCBA adapter module in order to establish an electrical connection between the circuitry and/or other components of the test fixture 10 and the PCBAs. As such, the PCBAs may incur testing that determines an operating performance of the PCBAs to verify that the PCBAs are operating effectively.

In some examples, the receiver-side interface 14 is coupled to a mounting rail 22 of the receiver housing 12 via mounting fasteners 24 (e.g., screws, bolts, rivets, etc.) extending into openings 26 of the receiver housing 12. As discussed below with reference to FIG. 8, the fasteners 24 may include various features, such as a curved disc spring (e.g., a curved washer) that enables the receiver-side interface 14 to move with respect to the receiver housing 12. This gives the mounting hole openings 26 of the receiver-side interface 14 some diametric clearance (e.g., between 0.010 and 0.020 inch, about 0.014 inch, 0.015 inch, 0.016 inch, or more or less) allowed by the mounting fastener 24 (e.g., shoulder screw) and the curved disc spring that allow the receiver-side interface 14 to adjust to the fit tolerances of a given receiver/adapter pair and then holds the receiver-side interface 14 block in its last position for the best possible fit for later mate/demate cycles.

While the illustrated example of FIG. 1 shows a single receiver-side interface 14, in other examples, the test fixture 10 may include two, three, four, five, six, seven, eight, nine, ten, or more than ten of the receiver-side interfaces 14 coupled to the mounting rail 22 of the receiver housing 12. In some examples, the housing of the test fixture 10 may include a handle 25 that allows a user to manually raise and/or lower a locking component 28 of the test fixture 10. For example, the PCBA adapter module may be inserted into the opening 16 when the locking component 28 is in an open or raised position. Further, the locking component 28 may secure and/or block movement of the PCBA adapter module when the locking component 28 is in a closed or lowered position. As such, an electrical connection between the PCBA adapter module and the receiver-side interface 14 may be maintained upon closing the locking component 28.

As set forth above, inserting the PCBA adapter module into the opening 16 of the test fixture 10 may cause the user and/or operator to tilt or angle the PCBA adapter module with respect to an axis 30 defining a height 32 of the receiver housing 12 of the test fixture 10. In other words, the PCBA adapter module may include a volume that is slightly less than a volume formed by an inner perimeter 34 of the receiver housing 12 that defines the opening 16. As such, the PCBA adapter module is inserted into the receiver housing 12 along an insertion angle plane with respect to the axis 30. That is, the PCBA adapter module may be inserted into the receiver housing 12 at an angle between normal and parallel to the receiver-side interface 14—not directly into the interface from a perfectly normal angle. Unfortunately, the insertion angle at which the PCBA adapter module is inserted into the receiver housing 12 may cause features of the receiver-side interface 14 to incur wear, which may affect an ability of the receiver-side interface 14 to align with an interface of the PCBA adapter module. For instance, the receiver-side interface 14 includes a first post 36 (e.g., an upper post with respect to the axis 30) and a second post 38 (e.g., a lower post with respect to the axis 30) that facilitate engagement of the receiver-side interface 14 with the interface of the PCBA adapter module. The first post 36 and the second post 38 may further cause the user to angle the PCBA adapter module to insert the posts 36, 38 into corresponding openings or holes of the interface of the PCBA adapter module. In existing systems, the PCBA adapter module may not include features that provide a substantial amount of flexibility with respect to the position of the PCBA adapter module in the opening 16. As noted above, with those systems, operators must take great care during insertion to never increase the adapter module's angle even slightly after having pushed the adapter module forward (post-insertion lifting) into the universal receiver. Unfortunately, such care is seldom rigorously adhered to at high-volume manufacturers with many operators. To address this, the adapter module-side interface and receiver-side interface described in this disclosure may be substantially immune to post-insertion lifting damage without sacrificing alignment accuracy.

Indeed, examples of the present disclosure are directed toward an improved interface of the PCBA adapter module that may increase the flexibility of the position of the PCBA adapter module within the opening 16 and facilitate alignment of the interface of the PCBA adapter module with the receiver-side interface 14 to reduce wear to the first post 36, the second post 38, and/or the plurality of pins 18.

Figure 2:
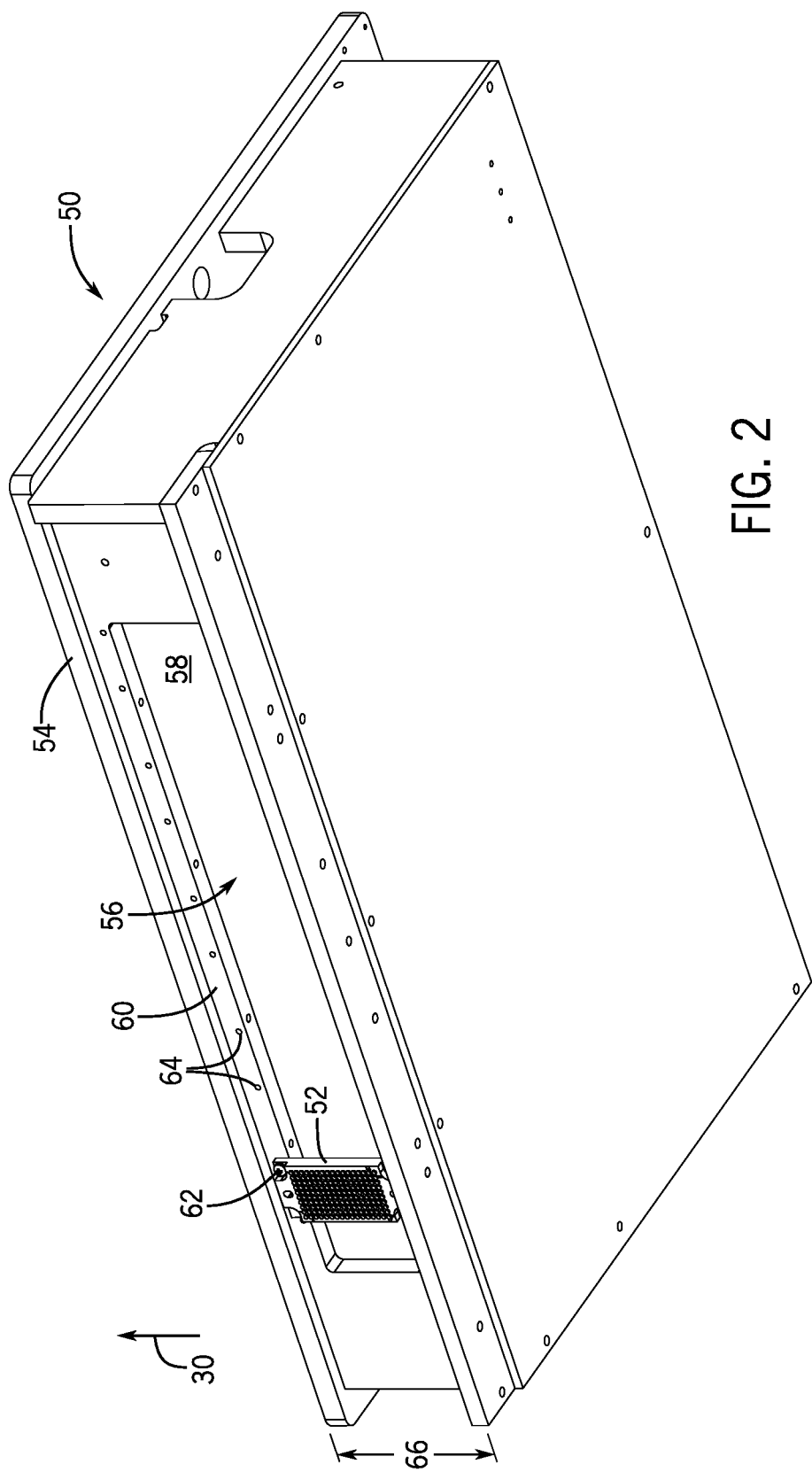
FIG. 2 is a perspective view of an example of the adapter module of the PCBA having an improved interface for electrically coupling the PCBA to the test fixture, in accordance with an example of the present disclosure.

For example, FIG. 2 is a perspective view of a PCBA adapter module 50 that includes an adapter module-side interface 52 (e.g., an interconnecting interface) that may facilitate electrically coupling the PCBA adapter module 50 to the receiver-side interface 14, and thus, to circuitry and/or other components of the test fixture 10. As shown in the illustrated example, the PCBA adapter module 50 includes a housing 54 that may be disposed within the opening 16 of the receiver housing 12 of the test fixture 10. The housing 54 includes a slot 56 that provides access to a cavity 58 of the housing 54. In some examples, the printed circuit board assemblies that can be held by the PCBA adapter module 50 are disposed and secured within the cavity 58 and communicatively coupled to a respective adapter module-side interface 52. While the illustrated example of FIG. 2 shows the PCBA adapter module 50 having a single adapter module-side interface 52, in other examples, the PCBA adapter module 50 includes two, three, four, five, six, seven, eight, nine, ten, or more than ten of the adapter module-side interfaces 52. The adapter module-side interface 52 may be coupled to a perimeter 60 surrounding the slot 56 via one or more fasteners 62 (e.g., screws, bolts, rivets, etc.). The fasteners 62 may extend into openings 64 disposed along the perimeter 60 to secure the adapter module-side interface 52 to the housing 54. The adapter module-side interface 52 is coupled to the housing 54, such that the adapter module-side interface 52 is substantially parallel to the axis 30, which also defines a height 66 of the housing 54 of the PCBA adapter module 50 (e.g., in addition to defining the height 32 of the test fixture 10).

Figure 3:
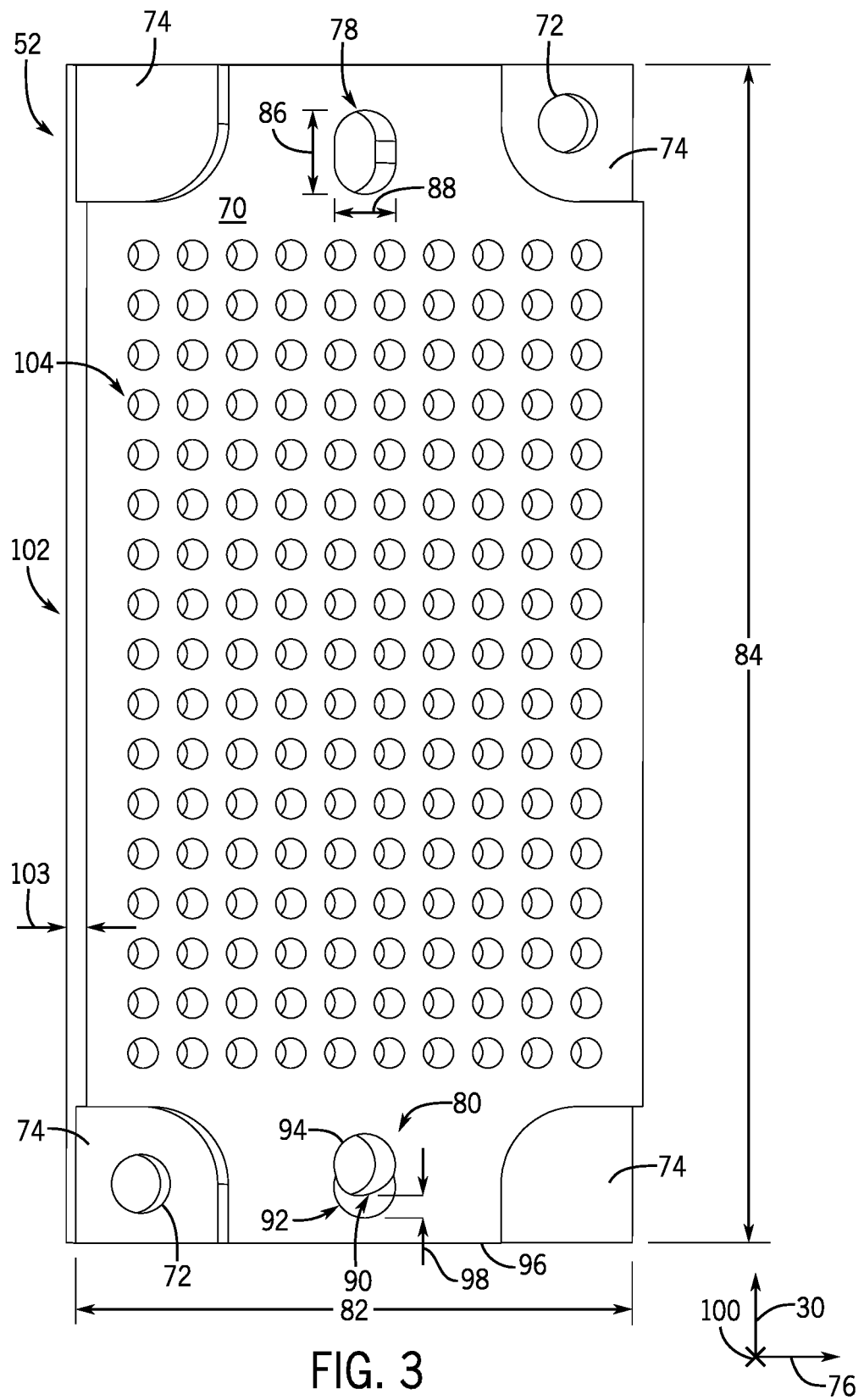
FIG. 3 is a perspective view of an example of the interface of FIG. 2, in accordance with an example of the present disclosure.

As set forth above, the adapter module-side interface 52 may include various features that enable the PCBA adapter module 50 to be aligned with the receiver-side interface 14 when inserted into the opening 16 of the receiver housing 12 along an insertion angle plane with respect to the axis 30. For example, FIG. 3 is a perspective view of an example of the adapter module-side interface 52 that may be coupled to the PCBA adapter module 50 of FIG. 2. In some examples, the adapter module-side interface 52 may include a rectangular shape or cross section. In other examples, the adapter module-side interface 52 may include another suitable prismatic shape that enables the adapter module-side interface 52 to be coupled to the housing 54 of the PCBA adapter module 50. Additionally or alternatively, the shape of the adapter module-side interface 52 may be adjusted in order to enable a surface 70 of the adapter module-side interface 52 to be substantially parallel to the axis 30 when the adapter module-side interface 52 is coupled to the PCBA adapter module 50. The adapter module-side interface 52 may be made of plastic, metal, carbon fiber, another polymeric material, or any other suitable material.

FIG. 3 illustrates a highly cost-effective and efficient example of the adapter module-side interface 52 that may be machined using readily available production techniques and equipment. In particular, the adapter module-side interface 52 may be formed or adjusted using a high-speed computer numerical control (CNC) drilling machine. By contrast, the examples of the adapter module-side interface 52 shown in FIGS. 5, 6, and 7 may be formed or adjusted using a CNC milling machine, which may be less readily available than a CNC drilling machine. In any event, the adapter module-side interface 52 shown in FIGS. 5, 6, and 7 may operate to connect to the receiver-side interface 14 in substantially the same way as the example of the adapter module-side interface 52 shown in FIG. 3. The adapter module-side interface 52 shown in FIG. 3, however, may be particularly cost effective and efficient owing to the ready availability of the tools used in its manufacture.

The adapter module-side interface 52 of FIG. 3 may have mounting holes 72 (e.g., mounting openings) that allow the fasteners 62 to attach the adapter module-side interface 52 to the housing 54. To facilitate insertion of the fasteners 62, the adapter module-side interface 52 may have pocketed corners 74 having respective surfaces that are offset from the surface 70 and/or extend a target depth from the surface 70. In some cases, the pocketed corners 74 may enable the fasteners 62 to extend below the grade of surface 70 when the fasteners 62 couple the adapter module-side interface 52 to the perimeter 60 of the housing 54. As shown in the illustrated example, the mounting holes 72 may be located in opposite pocketed corners of the adapter module-side interface 52 (e.g., opposite ends of the adapter module-side interface 52 with respect to the axis 30 and/or opposite sides of the adapter module-side interface 52 with respect to an axis 76 that is crosswise to the axis 30). While the illustrated example shows the adapter module-side interface 52 having two mounting holes 72, in other examples, the adapter module-side interface 52 may include one mounting hole 72 or more than two mounting holes 72. For example, the adapter module-side interface 52 may include a mounting hole 72 extending through each of the pocketed corners 74, and thus, include a total of four mounting holes 72.

The adapter module-side interface 52 may also include a first centering hole 78 (e.g., a first centering opening, a top centering hole, and/or a top centering opening) and a second centering hole 80 (e.g., a second centering opening, a bottom centering hole, and/or a bottom centering opening). The first centering hole 78 and the second centering hole 80 may be centered along a width 82 of the adapter module-side interface 52 with respect to the axis 76 and are on opposite ends of a length 84 of the adapter module-side interface 52, where the length 84 is defined by the axis 30. The first centering hole 78 is positioned above the second centering hole 80 with respect to the axis 30, such that the first centering hole 78 is engages the first post 36 of the receiver-side interface 14 and the second centering hole 80 engages the second post 38 of the receiver-side interface 14.

In one or more examples, the first centering hole 78 includes an obround or oblong shape. In other words, a cross-section of the first centering hole 78 may include an oval shape. In other examples, the first centering hole 78 may include a cross-sectional shape that is rectangular or another suitable shape that enables the first centering hole 78 to have a length 86 that is greater than a width 88 of the first centering hole 78. Further, the length 86 and the width 88 of the first centering hole 78 may include dimensions suitable to receive the first post 36. For example, the length 86 may span a distance (e.g., along the axis 30) that is greater than a diameter of the first post 36 to enable the first post 36 to move within the first centering hole 78 as the PCBA adapter module 50 is inserted into the opening 16 of the receiver housing 12. Further, the width 88 may span a distance (e.g., along the axis 76) that is slightly greater (e.g., 5% greater, 10% greater, or more than 10% greater) than the diameter of the first post 36, such that the width 88 may secure the first post 36 within the first centering hole 78. As set forth below with respect to FIGS. 5-7, which represent a version of the adapter module-side interface 52 that has less material machined away, but operates in a substantially similar way to that of FIG. 3, the geometry and dimensions of the first centering hole 78 enable the first post 36 to move within the first centering hole 78 to enable the adapter module-side interface 52 of the PCBA adapter module 50 to be aligned with the receiver-side interface 14 of the test fixture 10 to reduce wear on the first post 36 and/or the plurality of pins 18 of the test fixture 10.

Further still, the second centering hole 80 may include a circular hole (e.g., circular opening) having a chamfered lip 90. As shown in the illustrated example of FIG. 3, the chamfered lip 90 may be formed on a portion 92 of a perimeter 94 of the second centering hole 80, where the portion 92 is proximate to an edge 96 of the adapter module-side interface 52. In some examples, the portion 92 is the lowermost portion of the perimeter 94 of the second centering hole 80 with respect to the axis 30. Additionally or alternatively, the portion 92 extends along approximately (e.g., within 10% of, within 5% of, or within 1% of) 40% of the perimeter 94. In other examples, the portion 92 extends along between 5% and 70%, between 10% and 50%, or between 25% and 45% of the perimeter 94. The chamfered lip 90 may extend into the surface 70 of the adapter module-side interface 52 at a target depth 98 along an axis 100 that is crosswise to both the axis 30 and the axis 76. In some cases, the target depth 98 is less than a depth of the pocketed corners 74. Further, the target depth 98 of the chamfered lip 90 may be between 1% and 40%, between 3% and 25%, or between 5% and 15% of a distance from the surface 70 to an opposite surface 102 of the adapter module-side interface 52 (e.g., the distance defining a total thickness 103 of the adapter module-side interface 52). In any case, the chamfered lip 90 may be included on the portion 92 of the perimeter 94 of the second centering hole 80 to engage the second post 38 in a manner that enables the chamfered lip 90 to guide the second post 38 into the second centering hole 80 as the first post 36 engages the first centering hole 78 at an angle with respect to the axis 30. In other words, the chamfered lip 90 may provide clearance for the second post 38 from the surface 70 as the PCBA adapter module 50 is inserted into the opening 16 of the receiver housing 12 at the angle, as described below with reference to FIGS. 5-7, which represent a version of the adapter module-side interface 52 that has less material machined away, but operates in a substantially similar way to that of FIG. 3. Thus, forces applied to the second post 38 as the PCBA adapter module 50 is inserted into the opening 16 may be reduced by including the chamfered lip 90.

As shown in the illustrated example of FIG. 3, the adapter module-side interface 52 may include an array of pin holes 104 (e.g., an array of pin openings). The array of pin holes 104 may be circular and/or any other suitable shape that enables the array of pin holes 104 to receive corresponding pins of the plurality of pins 18 extending through the receiver-side interface 14 (e.g., protruding beyond an exposed surface of the receiver-side interface 14). In some examples, the array of pin holes 104 is aligned in a grid with rows and columns of pin holes. For example, each pin hole 104 may be approximately (e.g., within 10% of, within 5% of, within 1% of) 0.10 inches apart from an adjacent pin hole or pin holes 104. Thus, each pin hole 104 of the array of pin holes 104 may be spaced equidistant from one another. In other examples, each pin hole 104 of the array of pin holes 104 may be spaced at different distances from one another. In any case, the array of pin holes 104 may be arranged in order to mirror or correspond to locations of the plurality of pins 18 extending through the receiver-side interface 14. As should be understood, the first post 36 and the second post 38 may substantially align the plurality of pins 18 with the array of pin holes 104 with one another as the first post 36 and the second post 38 engage the first centering hole 78 and the second centering hole 80, respectively.

High-speed CNC drilling machines may be used for making interface blocks featuring hundreds of holes, such as the adapter module-side interface 52. The Z-axis (drilling depth) on such machines may not necessarily be simultaneously coordinated with the X- and Y-axis to produce swept 3-D surfaces. Drilling machines can be thought of as CNC-controlled routers inasmuch as their tooling spindles can either plunge in the Z-axis to a specified depth and then the X- and Y-axis can move and make enlarged pockets and radiuses, or, their X- and Y-axis can move to a certain position and then the Z-axis can plunge to a specific depth and then retract. Although this may preclude manufacturing swept surfaces with some CNC drilling machines, these same relatively readily available CNC drilling machines may be used to economically produce the adapter module-side interface 52. Indeed, due to the angle-insertion "timing" of an adapter being inserted into a receiver, the obround top first centering hole 78 (as well as a chamfered lip formed using a plunge with a conical bit for the lower second centering hole 80) would still provide desired alignment control while still providing substantial immunity to breakage due to post-insertion lifting.

Figure 4:
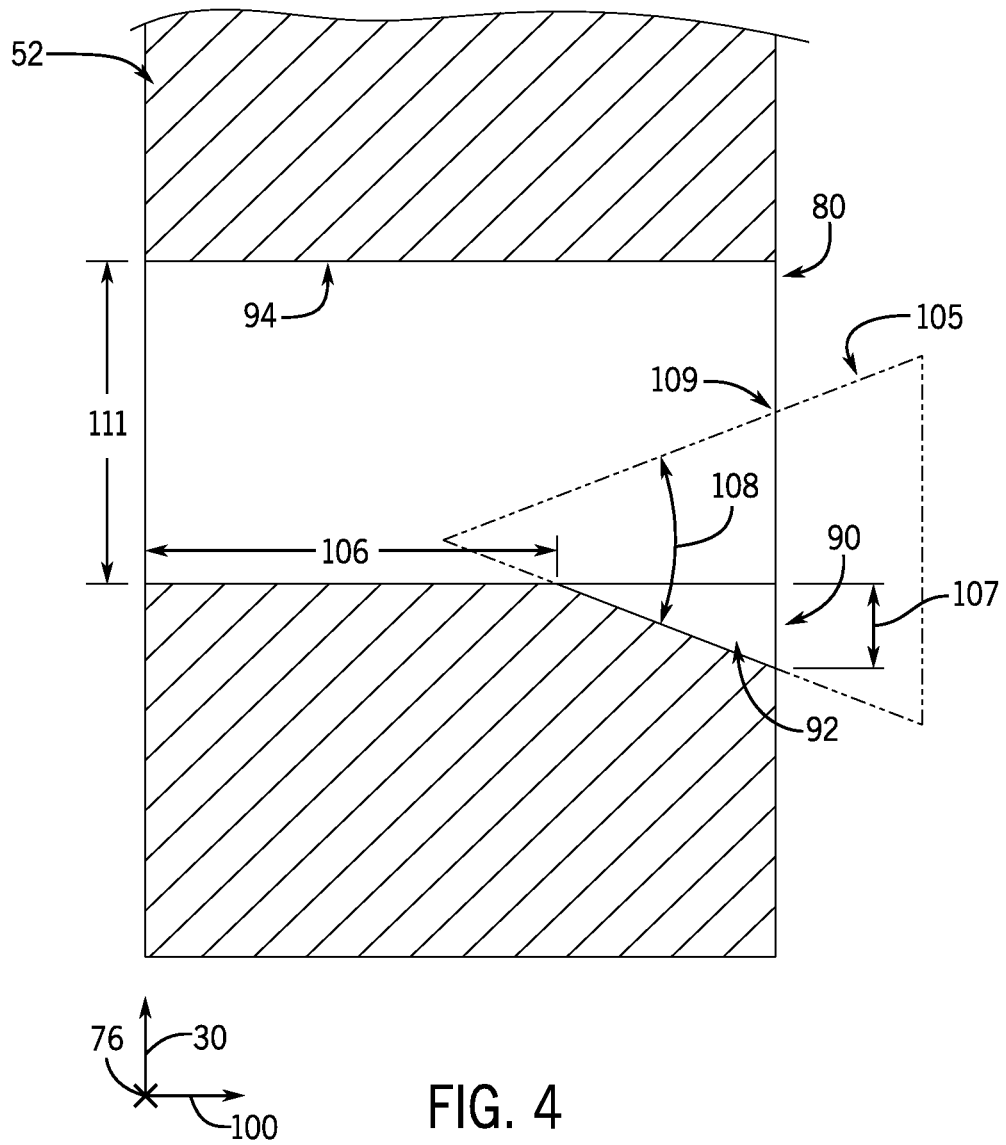
FIG. 4 is a cross-sectional view of a lower centering hole of the interface of FIG. 2, in accordance with an example of the present disclosure.

As shown in FIG. 4, the chamfered lip 90 of the lower second centering hole 80 may be produced using a plunge from a conical bit 105 on a CNC drilling machine. The conical bit 105 may plunge mill out material to generate the chamfered lip 90 while permitting at least a depth 106 of the second centering hole 80 to remain intact. The depth 106 may be any suitable depth that allows the secure mating of the receiver-side interface 14 to the adapter module-side interface 52 (e.g., at least deep enough to allow full registration of the two halves of an interface pair before their electrodes (the spring loaded contact pins and the dummy contacts) begin engaging). The material milled out to produce the chamfered lip 90 may extend an additional distance 107, which may be suitable distance to permit the second post 38 to clear the second centering hole 80 with greater margin. To achieve this, the conical bit 105 may have any suitable angle 108 and radius 109 at the outer lip of the second centering hole 80, which may vary depending on a diameter 111 of the depth 106 of the second centering hole 80. In one example, the diameter 111 may be approximately 0.1246 inches, the depth 106 may be approximately 4.40 mm, the distance 107 may be approximately 0.0443 inches, the angle 108 may be approximately 60 degrees, and the radius 109 may be approximately 0.0625 inches. However, any other suitable dimensions may be used that allow the second post 38 to move into the second centering hole 80 at a suitable angle in the space provided by the chamfered lip 90.

Thus, the adapter module-side interface 52 of FIG. 3 is excellently suited for the production equipment used to manufacture interface blocks. This provides a number of virtues, including that the first centering hole 78 and second centering hole 80 make the interface block mating pair substantially immune to breakage due to insertion-lift timing combinations (the various manners of post-insertion lifting that could occur). Additionally, the first centering hole 78 and the second centering hole 80 eliminates the need for expensive and only semi-effective metal reinforcements (though these may be included if desired). Indeed, even without such additional reinforcements, the first centering hole 78 and second centering hole 80 may provide complete X- and Y-axis registration control before and throughout the period when the electrical contact pins begin mating (thus minimizing wear). And producing the first centering hole 78 and second centering hole 80 adds just two simple and otherwise unremarkable steps in the machining process often employed when drilling and machining adapter module-side interfaces 52, and therefore entails virtually no additional manufacturing cost over adapter module-side interface blocks that lack these features.

Figure 5:
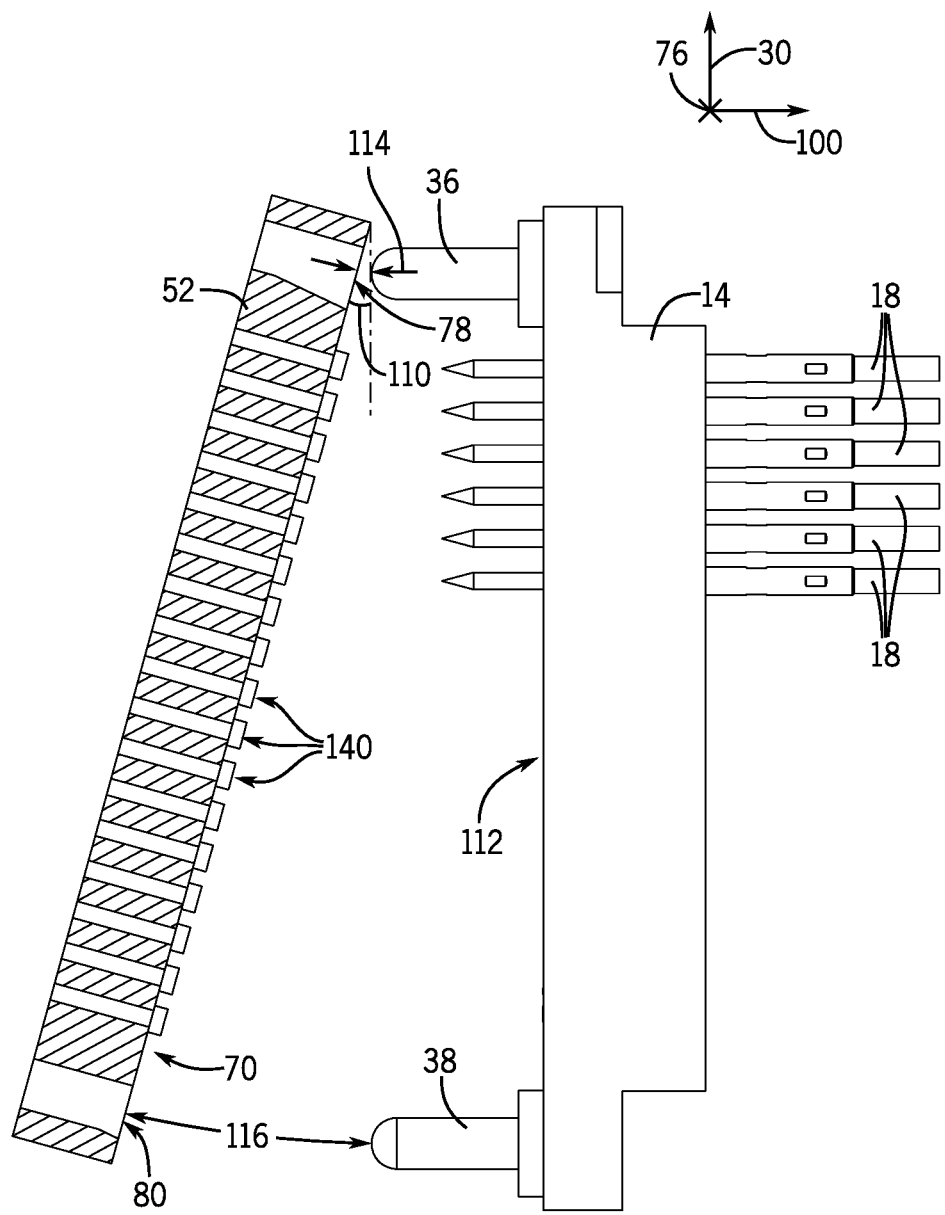
FIG. 5 is a schematic of an example of a first position of the interface and a receiver of the test fixture during a coupling process, in accordance with an example of the present disclosure.
Figure 6:
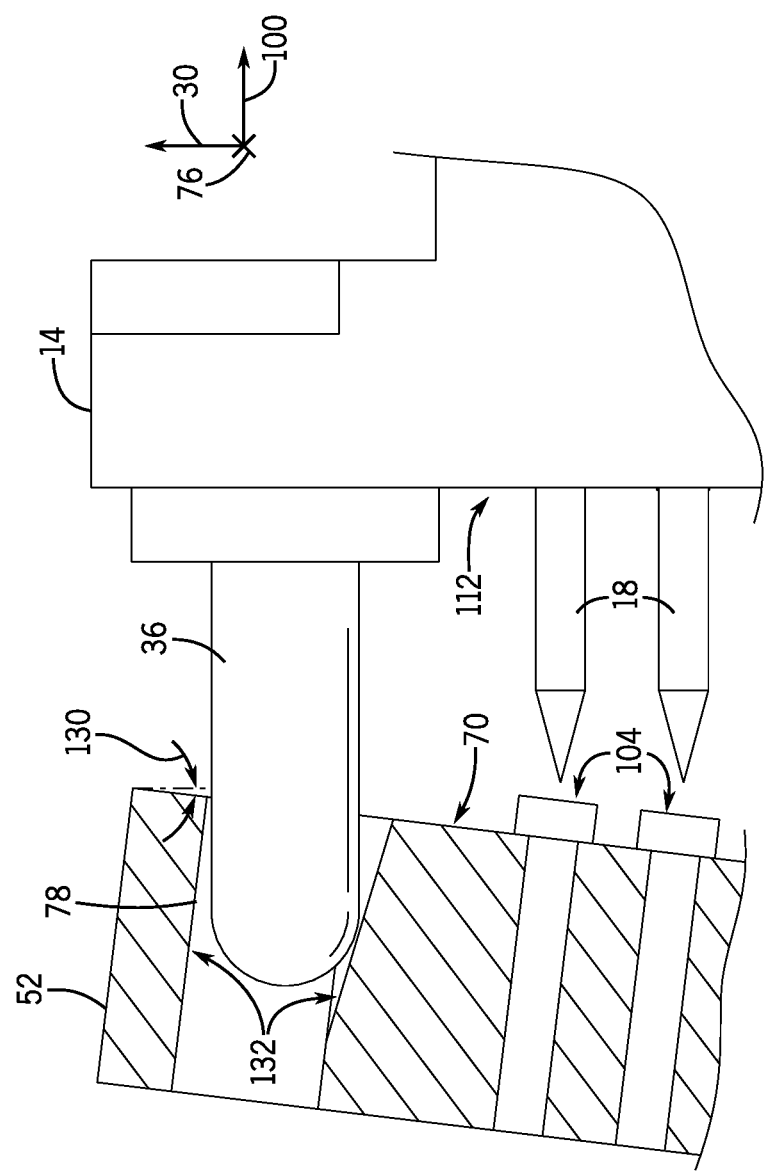
FIG. 6 is a schematic of an example of a first centering hole of the interface engaging a first post of the receiver of the test fixture, in accordance with an example of the present disclosure.
Figure 7:
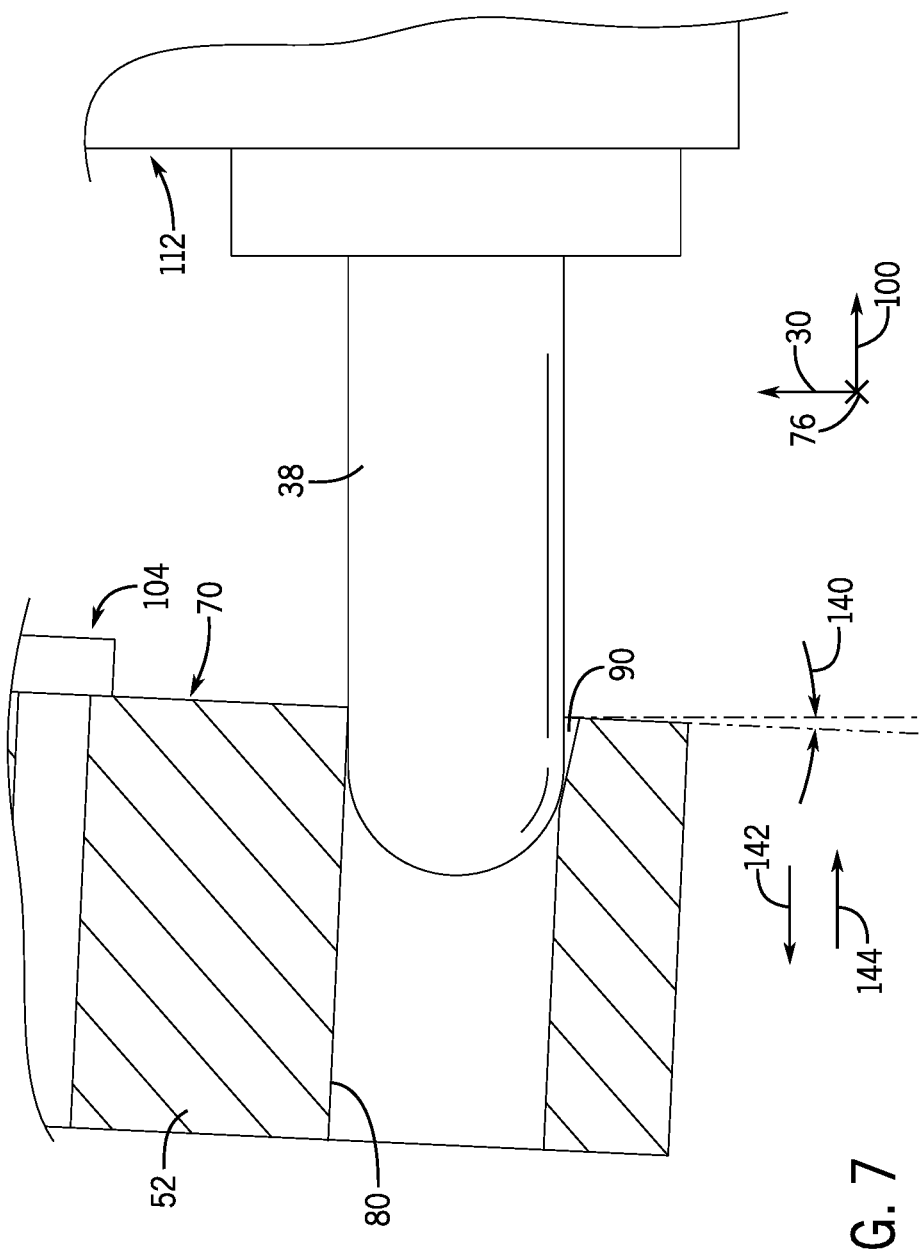
FIG. 7 is a schematic of an example of a second centering hole of the interface engaging a second post of the receiver of the test fixture, in accordance with an example of the present disclosure.

FIGS. 5-7 provide another example of an adapter module-side interface 52 that may be manufactured using other, less readily available tools. The example adapter module-side interface 52 shown in FIGS. 5-7 a minimal amount of material that may be removed while still achieving the aims of this disclosure, and thus may be manufactured using CNC milling tools that can coordinate simultaneous X-axis, Y-axis, and/or Z-axis movement while milling. As mentioned above, these tools may be more costly and/or less available than CNC drilling tools, which may be used to manufacture the example adapter module-side interface 52 of FIGS. 3 and 4, as mentioned above. Even so, the mating process illustrated in FIGS. 5-7 may operate in substantially the same way for the example adapter module-side interface 52 of FIGS. 3 and 4.

FIG. 5 is a schematic of an example of the adapter module-side interface 52 engaging the receiver-side interface 14 in a first position (e.g., a first insertion position). As shown in the example of FIG. 5, the adapter module-side interface 52 is positioned at angle 110 with respect to a surface 112 of the receiver 14 (e.g., an exposed surface of the receiver-side interface 14) as a result of insertion of the PCBA adapter module 50 into the opening 16 of the receiver housing 12. In other words, the surface 70 of the adapter module-side interface 52 is not parallel to the surface 112 of the receiver-side interface 14. In some examples, the angle 110 may be between 10 degrees (°) and 60°, between 15° and 55°, or between 30° and 50°. The angle 110 may enable the first post 36 to engage with the first centering hole 78 before the second post 38 engages the second centering hole 80. For instance, as shown in FIG. 5, the first post 36 and the first centering hole 78 are spaced apart a distance 114 that is less than a distance 116 separating the second post 38 and the second centering hole 80. The oblong shape of the first centering hole 78 provides space for the first post 36 to move within the first centering hole 78 as the distance 116 between the second post 38 and the second centering hole 80 decreases and without enabling the surface 70 to contact the plurality of pins 18. The oblong shape of the first centering hole 78 may also reduce forces applied to the first post 36 by the adapter module-side interface 52 by enabling increased movement within the first centering hole 78 (e.g., when compared to a first centering hole having a substantially circular shaped cross-section).

For example, FIG. 6 is a schematic of an example of the first centering hole 78 engaging the first post 36. In some examples, the first post 36 is disposed into the first centering hole 78 at an angle 130 (e.g., the angle 110 or a different angle). For example, the angle 130 may be between 1° and 25°, between 2° and 15°, or between 5° and 10°. In some examples, the oblong shape of the first centering hole 78 may reduce forces incurred by the first post 36 when disposed in the first centering hole 78. For instance, the first post 36 extends into the first centering hole 78 without contacting interior walls 132 of the adapter module-side interface 52 that define the first centering hole 78. While the adapter module-side interface 52 is positioned at the angle 130 with respect to the receiver-side interface 14, the first post 36 does not incur a weight and/or pressure forces exerted by the adapter module-side interface 52 as a result of the lack of contact with the interior walls 132. As such, the first post 36 may not incur wear, such as bending, that may affect the ability of the first post 36 to fully align the adapter module-side interface 52 and the receiver-side interface 14 (e.g., align the plurality of pins 18 with the array of pin holes 104). As set forth above, in existing systems, the adapter module-side interface 52 may include a circular shaped first centering hole, which may enable the first post 36 to contact the interior walls defining the circular shaped first centering hole. Thus, the weight of the adapter module-side interface 52 and/or pressure forces exerted by an operator may be exerted on the first post 36 as the first post 36 is inserted into the first centering hole at the angle 130. As such, the first post 36 may bend or otherwise incur wear that may affect the ability of the first post 36 to engage the first centering hole 78 and align the adapter module-side interface 52 with the receiver-side interface 14.

Further, as shown in the illustrated example of FIG. 6, the plurality of pins 18 do not engage and/or otherwise contact the surface 70 and/or the array of pin holes 104 as the first post 36 is inserted into the first centering hole 78. Accordingly, the oblong shape of the first centering hole 78 enables the first post 36 to be disposed within the first centering hole 78, while blocking contact between the surface 70 of the adapter module-side interface 52 and the plurality of pins 18. Once the first post 36 is positioned within the first centering hole 78, a position of the PCBA adapter module 50 (e.g., the housing 54 of the PCBA adapter module 50) may be adjusted to substantially align the surface 70 of the adapter module-side interface 52 with the surface 112 of the receiver-side interface 14 while maintaining a distance between the surface 70 and the plurality of pins 18.

For example, FIG. 7 is a schematic of an example of the second centering hole 80 aligned and disposed within the second post 38. As such, the housing 54 of the PCBA adapter module 50 is further inserted into the opening 16 by lowering a side of the housing 54 that is opposite to a side having the adapter module-side interface 52 into the opening 16, such that the entire housing 54 is disposed within the opening 16 (e.g., the housing 54 is not held up on one side by an operator). As set forth above, the chamfered lip 90 guides the second post 38 into the second centering hole 80. For instance, utilizing a circular second centering hole without a chamfered lip may not enable the second post 38 to be directly inserted into the circular second centering hole. Instead, the second post 38 may contact the surface 70 of the adapter module-side interface 52, which applies a force on the second post 38. The force exerted on the second post 38 that may cause the second post 38 to incur wear, such as bending. As such, the second post 38 may not be utilized sufficiently align the adapter module-side interface 52 with the receiver-side interface 14. However, the chamfered lip 90 may reduce the amount of force applied to the second post 38 as the second post 38 is inserted into the second centering hole 80. As shown in the illustrated example of FIG. 7, the surface 70 of the adapter module-side interface 52 may be at an angle 140 with respect to the surface 112 of the receiver-side interface 14. The angle 140 may be relatively small and enable the second post 38 to contact the chamfered lip 90, such that the chamfered lip 90 guides the second post 38 into the second centering hole 80. In some examples, the angle 140 may be less than 10°, less than 5°, less than 4°, less than 3°, less than 2°, or less than 1°. In any case, the chamfered lip 90 may reduce forces applied to the second post 38 by providing additional clearance for the second post 38, such that the second post 38 does not directly contact the surface 70 and incur additional forces.

Additionally, as the chamfered lip 90 guides the second post 38 into the second centering hole 80, the plurality of pins 18 may maintain a distance from the surface 70 and/or the array of pin holes 104 of the adapter module-side interface 52. Thus, the adapter module-side interface 52 and the receiver-side interface 14 may be aligned with one another before the plurality of pins 18 come into contact with any portion of the adapter module-side interface 52. The plurality of pins 18 do not incur forces applied by the adapter module-side interface 52 during the initial insertion of the PCBA adapter module 50 into the opening 16. In some examples, once the second post 38 is disposed within the second centering hole 80, as shown in FIG. 7, the adapter module-side interface 52 may be moved (e.g., via an operator) in a direction 142 along the axis 100. In other words, an operator may move the housing 54 of the PCBA adapter module 50 to direct the adapter module-side interface 52 in the direction 142 upon alignment of the adapter module-side interface 52 with the receiver-side interface 14 (e.g., alignment of the plurality of pins 18 with the array of pin holes 104). Movement of the adapter module-side interface 52 in the direction 142 may enable the angle 140 to be reduced even further (e.g., to approximately 0°). As such, the plurality of pins 18 are completely aligned with the array of pin holes 104 and the adapter module-side interface 52 may then be moved (e.g., by an operator) in a direction 144, opposite the direction 142, to insert the plurality of pins 18 into corresponding pin holes of the array of pin holes 104, fully insert the first post 36 into the first centering hole 78, and fully insert the second post 38 into the second centering hole 80. Thus, the electrical connection between the PCBA adapter module 50 and the test fixture 10 may be established.

Figure 8:
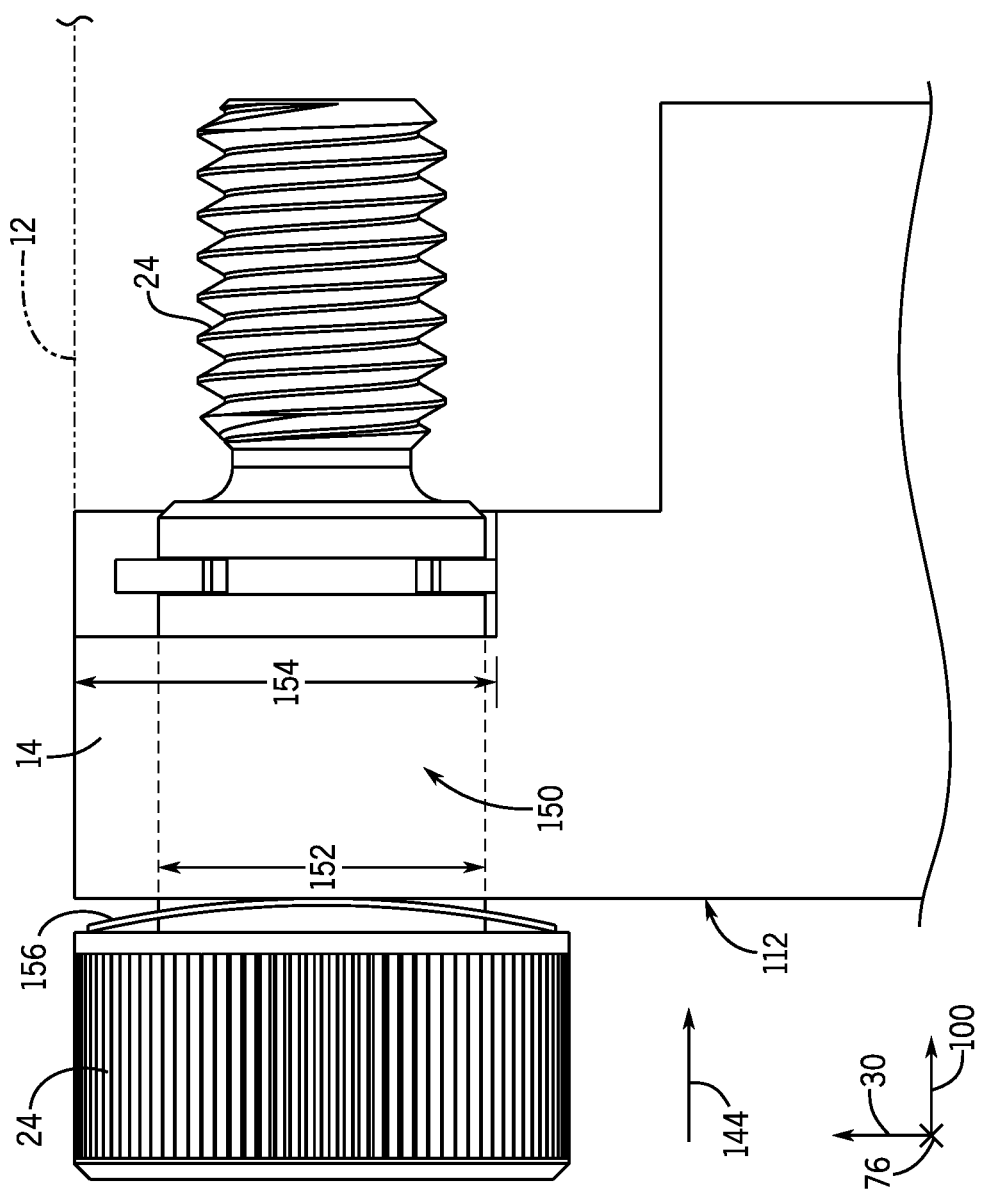
FIG. 8 is a schematic of an example of a captive fastener (e.g., shoulder screw) and curved disk spring that, when mated with an oversize mounting hole in the receiver-side interface, permits the receive-side interface to move slightly when its centering hardware is engaging the adapter-side interface and thusly accommodate misalignment between the receiver and the adapter module, in accordance with an example of the present disclosure.

As set forth above, the receiver-side interface 14 may be coupled to the receiver housing 12 of the test fixture 10 via features that enable the receiver-side interface 14 to move within a target range of motion with respect to the receiver housing 12. For instance, FIG. 8 is a plan view of an example of the receiver-side interface 14 coupled to the receiver housing 12 of the test fixture 10. As shown in the illustrated example of FIG. 8, one of the mounting fasteners 24 extends through the receiver-side interface 14 and into the receiver housing 12. The mounting fastener 24 extends through a mounting hole 150 (e.g., a mounting opening) of the receiver-side interface 14 and into an opening 26 of the receiver housing 12 to secure the receiver-side interface 14 to the receiver housing 12. The mounting fastener 24 may be a screw, a bolt, a rivet, or another suitable fastener capable of coupling the receiver-side interface 14 to the receiver housing 12. In some examples, the mounting fastener 24 is partially threaded and engages threads within the opening 26 of the receiver housing 12 to secure the receiver-side interface 14 to the receiver housing 12.

Further, a diameter 152 of the mounting fastener 24 may be less than a diameter 154 of the mounting hole 150 of the receiver-side interface 14. This may allow the receiver-side interface 14 to "float" (e.g., move within a target range of motion with respect to the receiver housing 12) around the mounting fastener 24 to provide additional free-play. In some examples, a curved disc spring 156 (e.g., a curved washer) may be disposed between the mounting fastener 24 and the surface 112 of the receiver-side interface 14. The curved disc spring 156 may apply a biasing force to the receiver-side interface 14 in the direction 144 toward the receiver housing 12. As such, the curved disc spring 156 may further secure the receiver-side interface 14 to the receiver housing 12. Thus, while the receiver-side interface 14 may move within a target range of motion (e.g., a differential between the diameter 154 of the mounting hole 150 and the diameter 152 of the mounting fastener 24), the curved disc spring 156 may maintain contact between the receiver-side interface 14 and the receiver housing 12 to enable a secure electrical connection between the receiver-side interface 14 and circuitry and/or other components of the test fixture 10. For example, the receiver-side interface 14 may move along the axes 30, 76 as the mounting hole 150 moves about the mounting fastener 24, but the curved disc spring 156 may maintain contact between the receiver-side interface 14 and the receiver housing 12 and hold and/or maintain a position of the receiver-side interface 14 with respect to the receiver housing 12 after the movement.

This gives the mounting hole openings 26 of the receiver-side interface 14 some diametric clearance (e.g., between 0.010 and 0.020 inch, about 0.014 inch, 0.015 inch, 0.016 inch, or more or less) allowed by the mounting fastener 24 (e.g., shoulder screw) and the curved disc spring 156 that allow the receiver-side interface 14 to adjust to the fit tolerances of a given receiver/adapter pair and then holds the receiver-side interface 14 block in its last position for the best possible fit for later mate/demate cycles. In this way, movement of the receiver-side interface 14 with respect to the receiver housing 12 may provide further flexibility to the operator when inserting the PCBA adapter module 50 into the opening 16 of the receiver housing 12. For example, the receiver-side interface 14 may move within the target range of motion to account for manufacturing tolerances of the adapter module-side interface 52 of the PCBA adapter module 50. Thus, as the PCBA adapter module 50 is inserted into the opening 16 of the receiver housing 12, the receiver-side interface 14 may move within the target range of motion to align the first post 36 and the second post 38 with the first centering hole 78 and the second centering hole 80, respectively. Further, the curved disc spring 156 may secure the receiver-side interface 14 at a position with respect to the receiver housing 12 once the receiver-side interface 14 has aligned with the adapter module-side interface 52 of the PCBA adapter module 50 to enable a secure electrical connection between the PCBA adapter module 50 and the test fixture 10. Indeed, using these features in combination with those discussed further above, the first post may substantially clear the first centering hole without causing either the receiver-side interface or the adapter module-side interface to exceed a limit of free-play between that interface and its respective mount.

Thus, technical effects of the present disclosure include systems for facilitating forming a connection between a printed circuit board assembly (PCBA) adapter module and a test fixture that may determine an operating performance of a PCBA coupled to or disposed in the PCBA adapter module. The systems described herein include an interface that may be coupled to a housing of a PCBA adapter module having improved structural features that enable the interface to reduce forces applied to alignment features and/or electrical connectors of the test fixture. For example, the interface may include an oblong or obround centering hole that receives a first post of a receiver of the test fixture at an angle. When disposed within the oblong or obround centering hole, the first post may not contact interior surfaces defining the oblong or obround centering hole, thus reducing forces applied on the first post by the interface. As the PCBA adapter module is moved within an opening of a housing of the test fixture, opposing surfaces of the interface and the receiver may be aligned (e.g., substantially parallel to one another). The interface may further include an additional centering hole that has a chamfered lip that guides a second post of the receiver into the additional centering hole and reduces forces applied to the second post as the PCBA adapter module is moved and/or angled within the opening. Further still, the receiver may be coupled to the housing of the test fixture in a manner that enables the receiver to move within a target range of motion. For instance, a mounting hole of the receiver may include a larger diameter than a fastener coupling the receiver to the housing of the test fixture. Thus, the receiver may move slightly during insertion of the PCBA adapter module to account for manufacturing tolerances of the interface and/or the PCBA adapter module. A curved disc (e.g., a curved disc spring) may be disposed between the receiver and the fastener to bias the receiver toward the housing and secure the receiver in a new position after movement of the receiver with respect to the housing. Thus, a secure connection between the PCBA adapter module and the test fixture may be achieved, while reducing forces applied to the centering features and/or electrical connectors of the test fixture. The operating life of the interface and/or the test fixture may be increased by utilizing the examples of the interface of the PCBA adapter module and the receiver of the test fixture disclosed herein.

While specific examples and applications of the disclosure have been illustrated and described, it is to be understood that the disclosure is not limited to the precise configurations and components disclosed herein. Accordingly, many changes may be made to the details of the above-described examples without departing from the underlying principles of this disclosure. The scope of the present disclosure should, therefore, be determined only by the following claims.

Indeed, the examples set forth in the present disclosure may be susceptible to various modifications and alternative forms, specific examples have been shown in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A modular printed circuit board assembly (PCBA) test system, comprising:
   a receiver housing comprising a first interface mounted on the receiver housing via a first mount; and
   a printed circuit board assembly (PCBA) adapter module comprising a second interface mounted on the adapter module via a second mount, wherein the adapter module is configured to be inserted into the receiver housing along an insertion-angle plane that is between normal and parallel to the first interface, wherein the second interface is configured to matingly engage with the first interface;
   wherein the first interface or the second interface comprises a first protruding feature to align the first interface and the second interface when the first interface and the second interface are matingly engaged, wherein the other of the first interface or the second interface comprises a first centering hole opposite the first protruding feature when the first interface and the second interface are matingly engaged, wherein the first centering hole is enlarged with respect to an axis of the insertion-angle plane such that the first protruding feature substantially clears the first centering hole without causing either the first interface or the second interface to exceed a limit of free-play between that interface and its respective mount, wherein the first centering hole comprises a chamfered lip portion and an unchamfered lip portion, and wherein the chamfered lip portion is configured to direct the first protruding feature into the first centering hole as the first protruding feature is inserted into the first centering hole at the insertion-angle plane.

2. The system of claim 1, wherein the first centering hole constrains alignment more in an X-axis than a Y-axis of the first interface.

3. The system of claim 1, wherein the first interface or the second interface comprises a second protruding feature to align the first interface and the second interface when the first interface and the second interface are matingly engaged, wherein the other of the first interface or the second interface comprises a second centering hole opposite the second protruding feature when the first interface and the second interface are matingly engaged, wherein the first centering hole is configured to begin engaging the first protruding feature before the second centering hole begins engaging the second protruding feature.

4. The system of claim 3, wherein the first centering hole is configured to constrain alignment more in an X-axis than a Y-axis of the first interface.

5. The system of claim 4, wherein the second centering hole is configured to constrain alignment more in the Y-axis than the first centering hole.

6. The system of claim 4, wherein the second centering hole is configured to be predominately responsible for alignment in the Y-axis before and throughout a travel range during which electrical contact pins are matingly engaged between the first interface and the second interface.

7. The system of claim 3, comprising one or more additional first centering holes and corresponding one or more additional first protruding features, wherein the one or more additional first centering holes are configured to begin engaging the one or more additional first protruding features before the second centering hole begins engaging the second protruding feature.

8. The system of claim 3, comprising one or more additional second centering holes and corresponding one or more additional second protruding features, wherein the first centering hole is configured to begin engaging the first protruding feature before the one or more additional second centering holes begin engaging the one or more additional second protruding features.

9. The system of claim 3, wherein the second centering hole is positioned below the first centering hole with respect to a height of the interface, and wherein the second centering hole comprises a chamfered lip.

10. The system of claim 1, wherein the first centering hole comprises an obround cross-sectional shape.

11. The system of claim 1, wherein the first mount comprises a fastener and a curved disc spring configured to provide diametric clearance to support free-play between the first interface and the receiver housing.

12. The system of claim 11, wherein the curved disc is configured to apply a biasing force to the receiver in a direction toward the receiver housing.

13. The system of claim 11, wherein the receiver housing comprises a mounting hole, wherein the fastener has a first diameter and the mounting hole has a second diameter, and wherein the second diameter is greater than the first diameter.

14. A system comprising:
a receiver housing comprising an opening and a receiver-side interface; and
a printed circuit board assembly (PCBA) adapter module configured to be positioned within the opening, wherein the adapter module comprises an adapter-module-side interface configured to matingly engage with the receiver-side interface;
wherein one of the adapter-module-side interface or the receiver-side interface comprises a first post and wherein the other of the adapter-module-side interface or the receiver-side interface comprises a first centering hole configured to receive the first post, wherein the first centering hole comprises an obround cross-sectional shape; and
wherein one of the adapter-module-side interface or the receiver-side interface comprises a second post and wherein the other of the adapter-module-side interface or the receiver-side interface comprises a second centering hole configured to receive the second post, wherein the second centering hole comprises a chamfered lip portion and an unchamfered lip portion, and wherein the chamfered lip portion is configured to direct the second post into the second centering hole as the second post is inserted into the second centering hole at an insertion-angle plane that is between normal and parallel to a second axis of the second centering hole.

15. The system of claim 14, wherein:
the first centering hole is configured to receive the first post at a first angle with respect to an axis defining a height of the interface; and
wherein the second centering hole is configured to receive the second post at a second angle with respect to the axis defining the height of the interface.

16. The system of claim 15, wherein the first angle is greater than the second angle.

17. The system of claim 14, comprising:
a fastener configured to couple the receiver-side interface to the receiver housing; and
a curved disc spring configured to be positioned between the fastener and the receiver.

18. The system of claim 17, wherein:
the curved disc is configured to apply a biasing force to the receiver in a direction toward the housing;
the fastener is configured to extend through a mounting hole of the receiver and into the housing of the test fixture;
the fastener has a first diameter and the mounting hole has a second diameter; and
the second diameter is greater than the first diameter.

19. An interface for a printed circuit board assembly (PCBA) adapter module, comprising:
a first centering hole comprising an obround cross-sectional shape and configured to receive a first post from a receiver-side interface;
a second centering hole positioned below the first centering hole with respect to a height of the interface and configured to receive a second post from the receiver-side interface, wherein the second centering hole comprises a chamfered lip portion and an unchamfered lip portion, and wherein the chamfered lip portion is configured to direct the second post into the second centering hole as the second post is inserted into the second centering hole at an insertion-angle plane that is between normal and parallel to a second axis of the second centering hole; and a pin hole array positioned between the first centering hole and the second centering hole with respect to the height of the interface, wherein the pin hole array includes a plurality of pin holes that extend from the first surface of the interface to the second surface of the interface.

20. The interface of claim 19, wherein:
the obround cross-sectional shape of the first centering hole is configured to receive the first post before the second centering hole receives the second post.

* * * * *